United States Patent
Audy

(10) Patent No.: US 8,319,567 B1
(45) Date of Patent: Nov. 27, 2012

(54) TWO OSCILLATOR SYNCHRONIZATION SYSTEM

(75) Inventor: Jonathan Mark Audy, Los Gatos, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/158,144

(22) Filed: Jun. 10, 2011

(51) Int. Cl.
*H03K 3/02* (2006.01)
*H03L 7/24* (2006.01)

(52) U.S. Cl. ........... 331/143; 331/111; 331/55; 331/172

(58) Field of Classification Search ............. 331/111, 331/143, 46, 55, 172
See application file for complete search history.

(56) References Cited

U.S. PATENT DOCUMENTS 4,623,852 A * 11/1986 Abou et al. ............. 331/111
7,504,895 B2 * 3/2009 Neidorff ............. 331/55

* cited by examiner

*Primary Examiner* — Ryan Johnson
(74) *Attorney, Agent, or Firm* — Koppel, Patrick, Heybl & Philpott

(57) ABSTRACT

An oscillator synchronization system employs two oscillators, each of which includes an integrator which provides a ramping signal at its output, a comparator which receives the ramping signal and a reference signal at respective inputs and toggles an output when the ramping voltage crosses the reference signal, and a one-shot circuit that generates the integrator's reset signal when triggered. The system is preferably arranged such that the oscillators can be operated independently, in which case each oscillator's one-shot is triggered by its own comparator output, or synchronously, in which case each oscillator's one-shot is triggered by the other oscillator's comparator output—with the ramp signal of each oscillator operating to reset the integrator of the other oscillator. The oscillators are typically out-of-phase when synchronized, with the phase difference varying with the magnitude of the reference signals applied to the comparators.

19 Claims, 2 Drawing Sheets

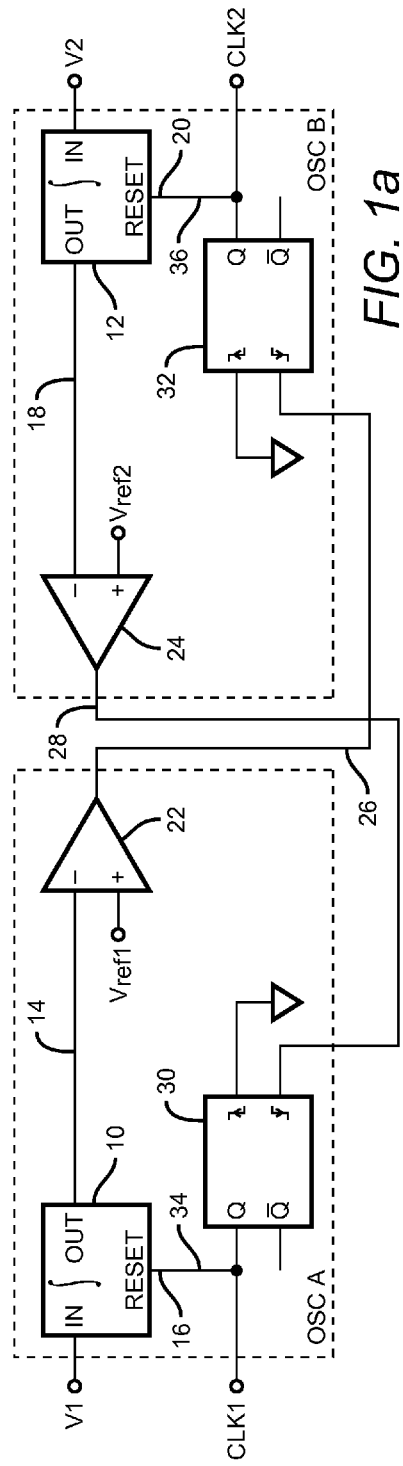
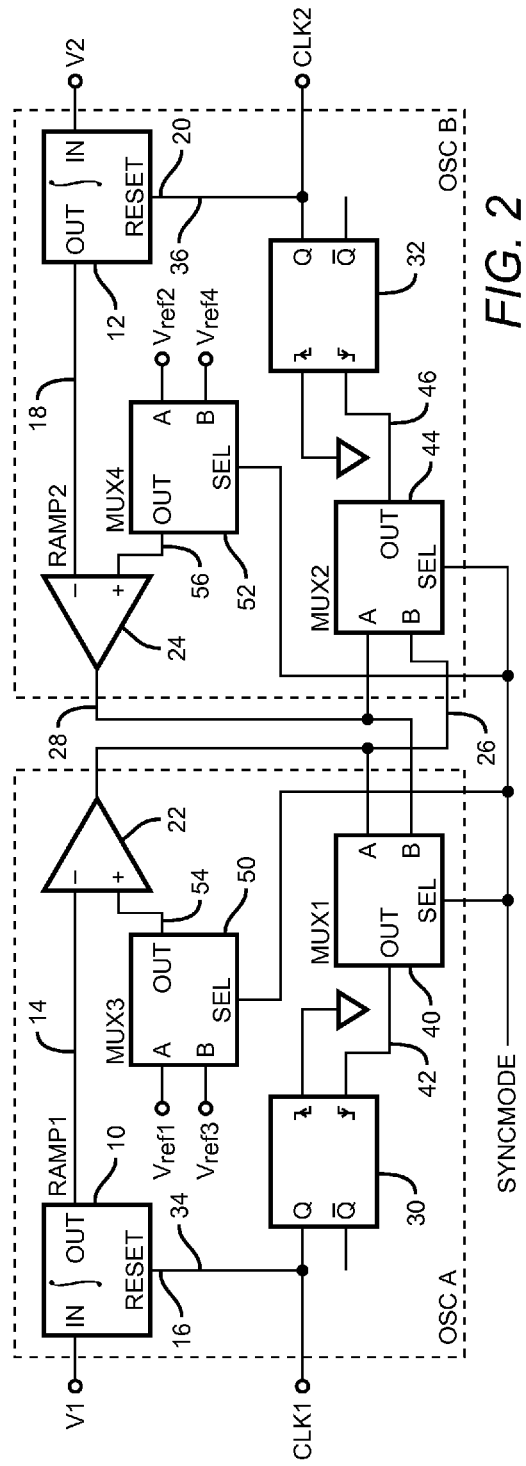

TWO OSCILLATOR SYNCHRONIZATION SYSTEM

BACKGROUND OF THE INVENTION

1. Field of the Invention

This invention relates to oscillators, and particularly to oscillators used to drive multiple switching regulators on a single integrated circuit (IC).

2. Description of the Related Art

Oscillator circuits are found in many different types of electronic circuitry. In some applications, two or more oscillators are employed, which may need to be at least occasionally synchronized.

For example, oscillators are found in the controller portions of most switching voltage regulator topologies. In some cases, multiple switching regulator controllers are provided on a single chip, with each controller having its own oscillator. Under some circumstances, it may be advantageous to have the operating frequencies of these multiple oscillators synchronized. For example, for a chip containing two switching regulator controllers arranged to use PWM to provide regulation, it is beneficial to have the controllers' 'on' pulses synchronized and out-of-phase, preferably by 180°. This can serve to reduce peak input current, as well as remove crosstalk interference between the two controllers, as both generate substantial noise on the chip's supply rails. However, at other times—under light load conditions, for example—the switching regulators might be arranged to enter a variable frequency mode, in which case the frequency synchronization should be terminated and the oscillators allowed to operate independently.

One type of oscillator employs an integrator which generates a ramping voltage, a comparator which determines when the ramping voltage crosses a predetermined threshold voltage, and a one-shot circuit that resets the integrator when the ramping voltage crosses the threshold. These types of oscillators can be particularly difficult to synchronize. For example, an asymmetrical master-slave arrangement can be employed; however, this can be problematic, as there is little that can be used to distinguish one switching regulator controller from the other. Also, oscillators tend to only be easily synchronized 'up' in frequency. This is because an external sync signal can early-terminate the ramp waveform; however, if the sync signal arrives after the internal reset signal, the reset signal has already done its work and it is too late. In addition, it can be difficult to determine which of the oscillators is at a higher frequency, in order to use it to 'sync up' the lower frequency oscillator. Another issue arises when it is desired to have the 'on' pulses synchronized and out-of-phase, preferably by 180° as discussed above, as syncing with an 180° phase shift requires some 'memory' of past events.

SUMMARY OF THE INVENTION

A two oscillator synchronization system and method are presented, which overcomes the problems noted above.

The present system employs two oscillators, each of which includes an integrator having input, output and reset nodes and which provides a signal at its output node that ramps at a rate proportional to a signal applied at its input node; each integrator's output signal being resettable by applying a reset signal to its reset node. A comparator receives the integrator's output signal and a reference signal at respective inputs, and toggles an output when the integrator's output signal crosses the reference signal.

Each oscillator also includes a one-shot circuit. When the oscillators are to be synchronized, each one-shot circuit receives the output of the other oscillator's comparator at an input, and generates the integrator's reset signal when the received comparator output toggles to indicate that the ramping integrator output signal has crossed the reference signal—such that the ramp signal of each oscillator operates to reset the integrator of the other oscillator. The system is arranged such that the reference signals provided to the comparators are at a first value when the oscillators run independently and are at a second value when the oscillators run synchronously.

The system can be arranged such that the oscillators are out-of-phase when synchronized, with the phase difference varying with the magnitude of the reference signals applied to the comparators. For example, the system is easily configured such that the two oscillators are synchronized and 180° out-of-phase. In a preferred embodiment, the system includes means to enable the oscillators to be switched between synchronous operation and independent operation. Note that the signals referred to above may be voltages or currents.

Further features and advantages of the invention will be apparent to those skilled in the art from the following detailed description, taken together with the accompanying drawings.

BRIEF DESCRIPTION OF THE DRAWINGS

FIG. 1a is a schematic diagram illustrating the basic principles of a two oscillator synchronization system per the present invention.

FIG. 2 is a schematic diagram of a preferred embodiment of a two oscillator synchronization system per the present invention.

DETAILED DESCRIPTION OF THE INVENTION

Figure 1B:
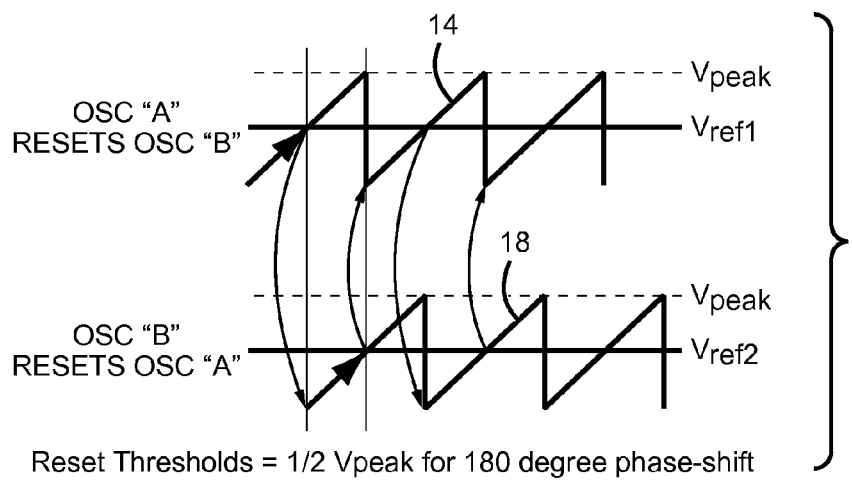
FIG. 1b is a timing diagram illustrating the basic operation of the present two oscillator synchronization system.

A schematic diagram illustrating the basic principles of the present two oscillator synchronization system is shown in FIG. 1a. The system includes first and second oscillators, identified as oscillators 'A' and 'B' in FIG. 1a. Note that, though the discussion below identifies the various signals as 'voltages', the present system could alternatively be implemented with the signals as currents.

Each oscillator includes an integrator circuit (10, 12) which has input, output and reset nodes, and is arranged to provide a voltage at its output node which ramps at a rate proportional to a voltage applied at its input node; each integrator's output voltage is resettable by applying a reset signal to its reset node. Thus, for oscillator A, a voltage V1 is applied to the input of integrator 10, and its output 14 will ramp at a rate proportional to V1 until being reset by the application of a reset signal to its reset node 16. When reset, the integrator's output voltage would typically fall to zero, though a non-zero minimum voltage is also possible. Similarly, for oscillator B, a voltage V2 is applied to the input of integrator 12, and its output 18 will ramp at a rate proportional to V2 until being reset by the application of a reset signal to its reset node 20. It is convenient, though not essential, that voltages V1 and V2 be equal.

Each oscillator also includes a comparator (22, 24) which receives its integrator's output voltage and a reference voltage at respective inputs, and is arranged to toggle an output when its integrator's output voltage crosses the reference voltage.

In the exemplary embodiment shown, for oscillator A, comparator 22 is connected to the output 14 of integrator 10 at its inverting input, and to a reference voltage $V_{ref1}$ at its non-inverting input. Similarly, for oscillator B, comparator 24 is connected to the output 18 of integrator 12 at its inverting input, and to a reference voltage $V_{ref2}$ at its non-inverting input. When so arranged, the output 26 of comparator 22 toggles from high to low when voltage 14 exceeds $V_{ref1}$, and the output 28 of comparator 24 toggles from high to low when voltage 18 exceeds $V_{ref2}$.

Each oscillator also includes a one-shot circuit (30, 32) which is arranged to receive the output of the other oscillator's comparator at an input, and to generate the reset signal used by the integrator when the received comparator output toggles to indicate that the ramping integrator output voltage has crossed the reference voltage. Thus, for oscillator A, one-shot 30 receives the output 28 produced by the comparator of oscillator B, and generates a reset signal 34 provided to the reset node 16 of integrator 10. For oscillator B, one-shot 32 receives the output 26 produced by the comparator of oscillator A, and generates a reset signal 36 provided to the reset node 20 of integrator 12.

When arranged as shown in FIG. 1a, the ramp voltage of each oscillator operates to reset the integrator of the other oscillator, which causes the oscillators to run synchronously. This is illustrated in the timing diagram shown in FIG. 1b. When the ramp voltage 14 of oscillator A exceeds $V_{ref1}$, the output 26 of comparator 22 toggles and triggers the one-shot circuit 32 of oscillator B, thereby resetting integrator 12 and causing ramp voltage 18 to fall. Then, when oscillator B's ramp voltage 18 exceeds $V_{ref2}$, the output 28 of comparator 24 toggles and triggers the one-shot circuit 30 of oscillator A, thereby resetting integrator 10 and causing ramp voltage 14 to fall. This cycle repeats periodically. The system is arranged such that the reference voltages provided to the comparators are at a first value when the oscillators run independently and are at a second value when the oscillators run synchronously.

This arrangement causes the oscillators to be out-of-phase when synchronized, with the phase difference varying with the magnitude of the reference voltages applied to the comparators. As such, any phase-shift can be obtained just by altering the reference voltages. If the two oscillators are to be 180° out-of-phase when synchronized, the reference voltages should be equal to one-half of the ramp voltages "peak" voltages $V_{peak}$. For example, if $V_{peak}=2.6$ volts, the oscillators will be synchronized and 180° out-of-phase when $V_{ref1}$ and $V_{ref2}$ are made equal to 1.3 volts.

An advantage of the present system is that it no longer matters which oscillator has the higher frequency—the final operating frequency for each of the synchronized oscillators will be the average of the two oscillator frequencies if they were 'unsynced'. Past-event 'memory' is inherent, as each oscillator hands over its timing information to the other.

Each of integrators 10 and 12 preferably comprises a capacitor connected between the integrator's input node and circuit ground, and a switching element arranged to discharge the capacitor to ground when closed in response to a reset signal applied to the integrator's reset node.

Figure 1C:
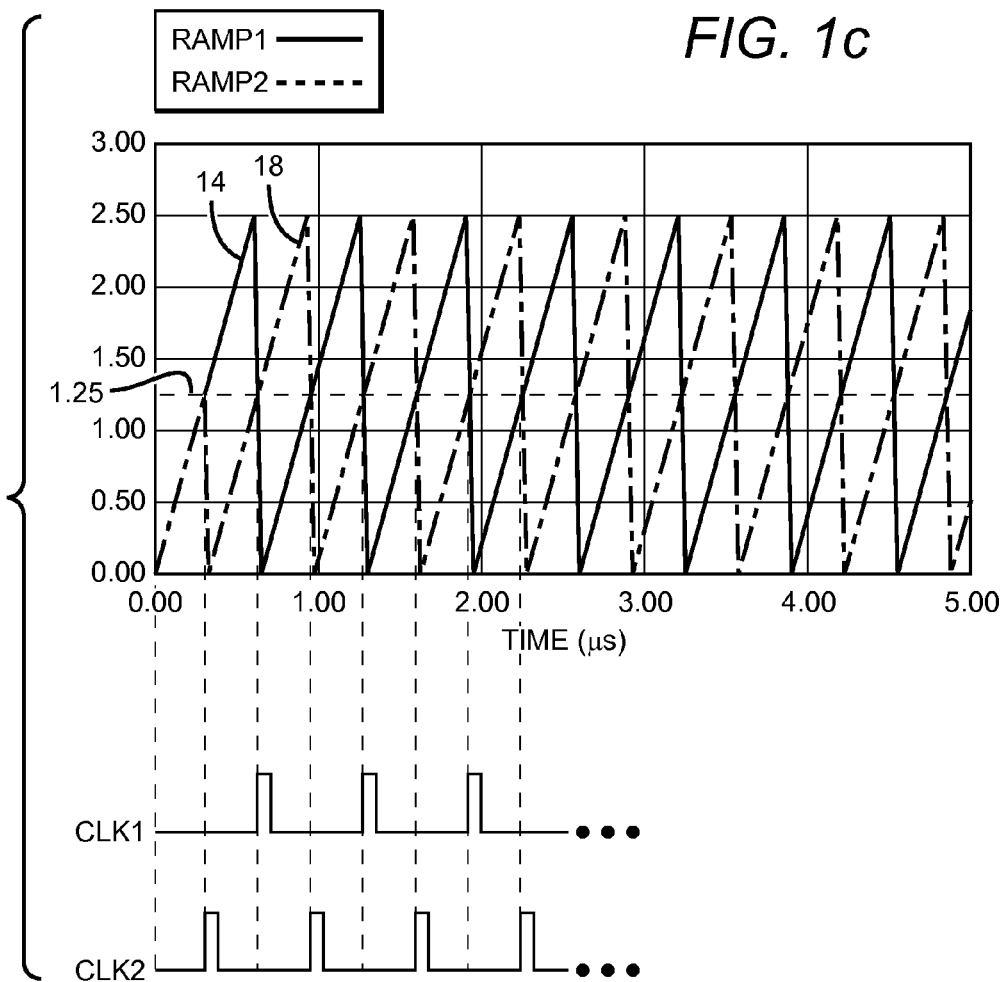
FIG. 1c is a more detailed timing diagram illustrating the operation of the present two oscillator synchronization system.

A more detailed timing diagram in shown in FIG. 1c. Here, the peak ramp voltage is about 2.5 volts and $V_{ref1}$ and $V_{ref2}$ have been made equal to 1.25 volts, resulting in the oscillators being synchronized and 180° out-of-phase. As noted above, each of the oscillators' one-shot circuits generates a reset signal which resets the other oscillator's integrator when its ramp voltage exceeds the 1.25 volt threshold. The reset signal is typically a short duration pulse; these reset pulses, which are shown in FIG. 1c, can also serve as the output clock signals CLK1 and CLK2 for oscillator A and B, respectively.

A simplified schematic of a preferred embodiment of the present two oscillator synchronization system is shown in FIG. 2. When configured as shown, the two oscillators can be commanded to operate synchronously or independently. As in FIG. 1a, the system consists of oscillator A and oscillator B, each of which includes an integrator (10, 12) which outputs a ramping voltage until reset, a comparator (22, 24) which toggles an output when the ramping voltage crosses a reference voltage, and a one-shot circuit (30, 32) which generates the integrator's reset signal when the comparator output received at its input toggles to indicate that the ramping integrator output voltage has crossed the reference voltage.

Here, however, each oscillator also includes a mode selection switching circuit, each of which is arranged to receive the outputs of both comparators at respective inputs, and to provide a selected one of the comparator outputs at its output in response to a select signal. The system is arranged such that each of the oscillators runs independently when its mode selection switching circuit provides the oscillator's own comparator output to its one-shot circuit, and such that the oscillators run synchronously when each oscillator's mode selection switching circuit provides the comparator output of the other oscillator to its one-shot circuit—such that the ramp voltage of each oscillator operates to reset the integrator of the other oscillator.

This is illustrated in FIG. 2. Oscillator A includes a mode selection switching circuit 40 which receives the outputs (26, 28) of comparators 22 and 24 at respective inputs, and provides a selected one of the inputs at an output 42 in response to a select signal (SYNCMODE) applied to a 'select' input. Output 42 is connected to the input of oscillator A's one-shot circuit 30. Similarly, oscillator B includes a mode selection switching circuit 44 which receives the outputs of comparators 22 and 24 at respective inputs and provides a selected one of the inputs at an output 46 in response to select signal SYNCMODE. Output 46 is connected to the input of oscillator B's one-shot circuit 32. Mode selection switching circuits 40 and 44 are suitably implemented with two-to-one digital multiplexers, though other types of switching circuits might also be used.

As noted above, the reference voltages applied to the comparators when the oscillators are synchronized must be less than those used when they are operating independently. This is preferably accommodated with first and second reference voltage switching circuits 50, 52; these circuits are suitably implemented using analog multiplexers. Circuit 50 is arranged to receive reference voltages $V_{ref1}$ and $V_{ref3}$ at respective inputs and to provide a selected one of these two reference voltages at an output 54, which is coupled to the input of comparator 22, in response to a control signal. Similarly, circuit 52 receives reference voltages $V_{ref2}$ and $V_{ref4}$ at respective inputs and provides a selected one of these two reference voltages at an output 56, which is coupled to the input of comparator 24, in response to a control signal. One pair of reference voltages ($V_{ref1}$ and $V_{ref2}$, for example) would be set to values appropriate to operate the oscillators independently, and the other pair of reference voltages would be set to values appropriate to synchronous operation.

When so arranged, when SYNCMODE is in a first state, mode selection switching circuits 40 and 44 connect comparator output 26 to one-shot circuit 30 and comparator output 28 to one-shot circuit 32, respectively, and connect $V_{ref1}$ and $V_{ref2}$ to comparators 22 and 24, respectively, causing oscillators A and B to operate independently. Switching SYNCMODE to a second state serves to couple each comparator output to the one-shot circuit of the opposite oscillator and connects $V_{ref3}$ and $V_{ref4}$ to comparators 22 and 24, respectively, causing oscillators A and B to operate synchronously.

It is theoretically possible, though practically unlikely, that when desiring to operate the oscillators synchronously, both oscillators will start simultaneously and be perfectly in-phase with identical frequencies, in which case they would remain in-phase. This can be avoided by making the reference voltage applied to one comparator slightly different from that applied to the other comparator.

While particular embodiments of the invention have been shown and described, numerous variations and alternate embodiments will occur to those skilled in the art. Accordingly, it is intended that the invention be limited only in terms of the appended claims.

I claim:

1. A two oscillator system wherein said oscillators can be operated independently or synchronously, comprising:
    first and second oscillators, each comprising:
        an integrator having input, output and reset nodes and arranged to provide a signal at said output node which ramps at a rate proportional to a signal applied at said input node, said integrator output signal being resettable by applying a reset signal to said reset node;
        a comparator which receives said integrator's output signal and a reference signal at respective inputs and is arranged to toggle an output when said integrator's output signal crosses said reference signal;
        a mode selection switching circuit arranged to receive the outputs of both of said comparators at respective inputs and to provide a selected one of said comparator outputs at its output in response to a select signal; and
        a one-shot circuit which is arranged to receive the output of said mode selection switching circuit at an input and to generate said reset signal when said received switching circuit output toggles to indicate that the ramping integrator output signal provided to the comparator selected by said mode selecting switching circuit has crossed said reference signal;
    such that each of said oscillators runs independently when its mode selection switching circuit provides said oscillator's own comparator output to its one-shot circuit, and such that the ramp voltage of each oscillator operates to reset the integrator of the other oscillator such that said oscillators run synchronously when said oscillators' mode selection switching circuits provide the comparator output of said other oscillator to their one-shot circuits;
    said system arranged such that the reference signals provided to said comparators are at a first value when said oscillators run independently and are at a second value when said oscillators run synchronously.

2. The system of claim 1, wherein said mode selection switching circuits are two-to-one digital multiplexers.

3. The system of claim 1, wherein said system is arranged such that said oscillators are out-of-phase when synchronized, wherein said phase difference varies with the magnitude of the reference signals applied to said comparators.

4. The system of claim 3, wherein said system is arranged such that said oscillators are 180° out-of-phase when synchronized.

5. The system of claim 1, wherein said first and second oscillators operate at first and second frequencies, respectively, when running independently, said system arranged such that each of said oscillators operates at a frequency equal to the average of said first and second frequencies when synchronized.

6. The system of claim 1, wherein said second value is approximately half of said first value.

7. The system of claim 1, further comprising first and second reference signal switching circuits, each of which receives said first reference signal value and said second reference signal value at respective inputs and provides a selected one of said first and second reference signal values at an output in response to a control signal, the outputs of said first and second reference signal switching circuits provided to respective ones of said comparators.

8. The system of claim 1, wherein said reference signals applied to said comparators are made sufficiently unequal so as to ensure that the oscillators cannot operate in-phase when running synchronously.

9. The system of claim 1, wherein said signals are voltages.

10. The system of claim 1, wherein said signals are currents.

11. A two oscillator system wherein said oscillators can be operated independently or synchronously, comprising:
    first and second reference signals, said first reference signal being greater than said second reference signal;
    first and second oscillators, each comprising:
        an integrator having input, output and reset nodes and arranged to provide a signal at said output node which ramps at a rate proportional to a signal applied at said input node, said integrator output signal being resettable by applying a reset signal to said reset node;
        a comparator which receives said integrator's output signal and a reference signal at respective inputs and is arranged to toggle an output when said integrator's output signal crosses said reference signal;
        a mode selection two-to-one digital multiplexer arranged to receive the outputs of both of said comparators at respective inputs and to provide a selected one of said comparator outputs at its output in response to a select signal having an 'independent' state and a 'synchronous' state;
        a reference signal switching circuit arranged to receive said first and second reference signals at respective inputs and to provide said first reference signal to said comparator when said select signal is in said 'independent' state and to provide said second reference signal to said comparator when said select signal is in said 'synchronous' state; and
        a one-shot circuit which is arranged to receive the output of said mode selection switching circuit at an input and to generate said reset signal when said received switching circuit output toggles to indicate that the ramping integrator output signal provided to the comparator selected by said mode selection multiplexer has crossed said reference signal;
    such that each of said oscillators runs independently when its mode selection multiplexer provides said oscillator's own comparator output to its one-shot circuit, and such that the ramp signal of each oscillator operates to reset the integrator of the other oscillator such that said oscillators run synchronously and out-of-phase when said oscillators' mode selection multiplexers provide the comparator output of said other oscillator to their one-shot circuits,
    wherein said first and second oscillators operate at first and second frequencies, respectively, when running independently, said system arranged such that each of said oscillators operates at a frequency equal to the average of said first and second frequencies when synchronized.

12. The system of claim 11, wherein said phase difference varies with the magnitude of said reference signals provided to said comparators.

13. The system of claim 11, wherein said signals are voltages.

14. The system of claim 11, wherein said signals are currents.

15. A two oscillator system wherein said oscillators operate synchronously, comprising:
  first and second oscillators, each comprising:
    an integrator having input, output and reset nodes and arranged to provide a signal at said output node which ramps at a rate proportional to a signal applied at said input node, said integrator output signal being resettable by applying a reset signal to said reset node;
    a comparator which receives said integrator's output signal and a reference signal at respective inputs and is arranged to toggle an output when said integrator's output signal crosses said reference signal; and
    a one-shot circuit which is arranged to receive the output of the other oscillator's comparator at an input and to generate said reset signal when said received comparator output toggles to indicate that the ramping integrator output signal provided to the other oscillator's comparator has crossed said reference signal;
  such that the ramp signal of each oscillator operates to reset the integrator of the other oscillator such that said oscillators run synchronously.

16. The system of claim 15, wherein said system is arranged such that said oscillators are out-of-phase when synchronized, wherein said phase difference varies with the magnitude of the reference signals applied to said comparators.

17. The system of claim 16, wherein said system is arranged such that said oscillators are 180° out-of-phase when synchronized.

18. The system of claim 15, wherein said signals are voltages.

19. The system of claim 15, wherein said signals are currents.

* * * * *